US011335834B2

(12) United States Patent
Vo et al.

(10) Patent No.: US 11,335,834 B2
(45) Date of Patent: *May 17, 2022

(54) QUANTUM DOT FILMS UTILIZING MULTI-PHASE RESINS

(71) Applicant: Nanoco Technologies, Ltd., Manchester (GB)

(72) Inventors: Cong-Duan Vo, Manchester (GB); Imad Naasani, Manchester (GB); Amilcar Pillay Narrainen, Manchester (GB)

(73) Assignee: Nanoco Technologies, Ltd., Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/618,863

(22) Filed: Jun. 9, 2017

(65) Prior Publication Data

US 2017/0279013 A1 Sep. 28, 2017

Related U.S. Application Data

(63) Continuation of application No. 14/460,008, filed on Aug. 14, 2014, now Pat. No. 9,680,068.

(60) Provisional application No. 61/865,692, filed on Aug. 14, 2013.

(51) Int. Cl.
*B32B 37/24* (2006.01)
*C09K 11/02* (2006.01)
*B82Y 20/00* (2011.01)
*H01L 33/50* (2010.01)
*C09K 11/70* (2006.01)

(52) U.S. Cl.
CPC ............ *H01L 33/504* (2013.01); *B32B 37/24* (2013.01); *C09K 11/02* (2013.01); *C09K 11/703* (2013.01); *H01L 33/502* (2013.01); *B32B 2037/243* (2013.01); *B32B 2307/418* (2013.01); *B32B 2307/7242* (2013.01); *B82Y 20/00* (2013.01); *Y10T 156/10* (2015.01)

(58) Field of Classification Search
None
See application file for complete search history.

(56) References Cited

U.S. PATENT DOCUMENTS

| | | | |
|---|---|---|---|
| 5,990,984 A | 11/1999 | Meredith, Jr. et al. | |
| 7,332,211 B1 | 2/2008 | Bulovic et al. | |
| 7,816,669 B1 | 10/2010 | Nauka | |
| 8,187,708 B2 | 5/2012 | Lahann et al. | |
| 8,343,575 B2 | 1/2013 | Dubrow | |
| 8,618,561 B2 | 12/2013 | Coe-Sullivan | |
| 9,085,728 B2 | 7/2015 | Uchida et al. | |
| 10,316,245 B2 | 6/2019 | Nelson et al. | |
| 2005/0112376 A1 | 5/2005 | Naasani | |
| 2010/0123155 A1* | 5/2010 | Pickett | B82Y 15/00 257/98 |
| 2010/0193767 A1 | 8/2010 | Naasani et al. | |
| 2010/0213437 A1 | 8/2010 | Akai et al. | |
| 2010/0243991 A1 | 9/2010 | Nauka | |
| 2011/0068321 A1 | 3/2011 | Pickett et al. | |
| 2011/0079756 A1 | 4/2011 | Chun et al. | |
| 2011/0147778 A1 | 6/2011 | Ichikawa | |
| 2012/0184648 A1 | 7/2012 | Meegan et al. | |
| 2012/0301724 A1 | 11/2012 | Frauenrath et al. | |
| 2013/0075692 A1 | 3/2013 | Naasani et al. | |
| 2014/0097461 A1 | 4/2014 | Ito et al. | |
| 2015/0354786 A1* | 12/2015 | Ji | G02B 3/0025 315/297 |

FOREIGN PATENT DOCUMENTS

| | | |
|---|---|---|
| CN | 102648536 A | 8/2012 |
| EP | 2028248 A1 | 2/2009 |
| EP | 2517275 B1 | 7/2018 |
| JP | 2001-318201 | 11/2001 |
| JP | 2008-270786 | 11/2008 |
| JP | 2013-047324 | 3/2013 |
| KR | 1020117013535 A | 6/2011 |
| KR | 20110084324 A | 7/2011 |
| KR | 20110110669 A | 10/2011 |
| KR | 1020127010270 A | 4/2012 |
| KR | 20130000508 A | 1/2013 |
| KR | 20130065484 A | 6/2013 |
| TW | 201120112 A | 6/2011 |
| WO | 2010058162 A2 | 5/2010 |
| WO | 2011036446 A1 | 3/2011 |
| WO | 2011036447 A1 | 3/2011 |
| WO | 2012064562 A1 | 5/2012 |

OTHER PUBLICATIONS

EP Search Report issued in copending EPO Application No. 18186420 dated Nov. 16, 2018, 10 pages.
Choi, et al; "Polymers for flexible displays: From material selection to device applications"; Progress in Polymer Science; 2008; 33; pp. 581-630.
Harirchian-Saei, et al; "Directed Polystyrene/Poly(methyl methacrylate) Phase Separation and Nanoparticle Ordering on Transparent Chemically Patterned Substrates"; American Chemical Society; Langmuir; 2012; 28; pp. 10838-10848.
Matvienko, et al; "Dispersion and aggregation of quantum dots in polymer-inorganic hybrid films"; Thin Solid Films; 2013; 537; pp. 226-230.

(Continued)

*Primary Examiner* — Sheeba Ahmed
(74) *Attorney, Agent, or Firm* — Blank Rome, LLP

(57) ABSTRACT

Multi-phase polymer films containing quantum dots (QDs) are described herein. The films have domains of primarily hydrophobic polymer and domains of primarily hydrophilic polymer. QDs, being generally more stable within a hydrophobic matrix, are dispersed primarily within the hydrophobic domains of the films. The hydrophilic domains tend to be effective at excluding oxygen.

23 Claims, 4 Drawing Sheets

(56) References Cited

OTHER PUBLICATIONS

Schadel, et al; "Determination of Volume Fractions and Ligand Layer Thickness of Polymer/CdSe Quantum Dot Blend Films by Effective Medium Approximations"; Journal of Polymer Science Part B: Polymer Physics; 2012; 50; pp. 75-82.

Wang, et al.; Nonlithographic Hierarchical Patterning of Semiconducting Nanoparticles via Polymer/Polymer Phase Separation; Chem. Mater.; 2005; 17; pp. 3871-3878.

Petition for Cancellation of KR Patent No. 10-2025346 issued in co-pending KR Application No. 10-2017-7009836 dated Dec. 26, 2019, 72 pages.

* cited by examiner

QUANTUM DOT FILMS UTILIZING MULTI-PHASE RESINS

CROSS-REFERENCE TO RELATED APPLICATIONS:

This application is a continuation of U.S. application Ser. No. 14/460,008 filed Aug. 14, 2014, now issued as U.S. Pat. No. 9,680,068 which claims the benefit of U.S. Provisional Application No. 61/865,692 filed on Aug. 8, 2013, the contents of which are hereby incorporated by reference in their entirety.

FEDERALLY SPONSORED RESEARCH OR DEVELOPMENT

Not Applicable

FIELD OF THE INVENTION

The invention relates to materials comprising light emitting semi-conductor quantum dots (QDs), and more specifically, multi-phase polymer films incorporating QDs.

BACKGROUND

Light-emitting diodes (LEDs) are becoming more important to modern day life and it is envisaged that they will become one of the major applications in many forms of lighting such as automobile lights, traffic signals, general lighting, liquid crystal display (LCD) backlighting and display screens. Currently, LED devices are typically made from inorganic solid-state semiconductor materials. The material used to make the LED determines the color of light produced by the LED. Each material emits light with a particular wavelength spectrum, i.e., light having a particular mix of colors. Common materials include AlGaAs (red), AlGaInP (orange-yellow-green), and AlGaInN (green-blue).

LEDs that produce white light, which is a mixture of fundamental colors (e.g., red, green and blue) or that produce light not available using the usual LED semiconductor materials are needed for many applications. Currently the most usual method of color mixing to produce a required color, such as white, is to use a combination of phosphorescent materials that are placed on top of the solid-state LED whereby the light from the LED (the "primary light") is absorbed by the phosphorescent material and then re-emitted at a different frequency (the "secondary light"). The phosphorescent material "down converts" a portion of the primary light.

Current phosphorescent materials used in down-converting applications typically absorb UV or blue light and convert it to light having longer wavelengths, such as red or green light. A lighting device having a blue primary light source, such as a blue-emitting LED, combined with secondary phosphors that emit red and green light, can be used to produce white light.

The most common phosphor materials are solid-state semiconductor materials, such as trivalent rare-earth doped oxides or halophosphates. White emission can be obtained by blending a blue light-emitting LED with a green phosphor such as, $SrGa_2S_4{:}Eu_2^{2+}$ and a red phosphor such as, $SrSi_5Ni_8{:}Eu_2^{2+}$ or a UV light-emitting LED plus a yellow phosphor such as, $Sr_2P_2O_7{:}Eu^{2+}$; $Mn^{2+}$, and a blue-green phosphor. White LEDs can also be made by combining a blue LED with a yellow phosphor.

Several problems are associated with solid-state down-converting phosphors. Color control and color rendering may be poor (i.e., color rendering index (CRI)<75), resulting in light that is unpleasant under many circumstances. Also, it is difficult to adjust the hue of emitted light; because the characteristic color emitted by any particular phosphor is a function of the material the phosphor is made of. If a suitable material does not exist, then certain hues may simply be unavailable. There is thus a need in the art for down-converting phosphors having greater flexibility and better color rendering than presently available.

BRIEF SUMMARY OF THE INVENTION

Films containing QDs are described herein. The films may be used as components for LED lighting devices, particularly, as phosphor films for down-converting light emitted from a solid-state LED semiconductor material.

The films are formed from two or more polymer materials, for example, two or more polymer resins. The films at least partially phase-separate, such that some domains within a film are primarily one of the polymer materials and other domains within the film are primarily the polymer material. One of the polymer materials is chosen to be highly compatible with the QDs. Another of the polymer materials is highly effective at excluding oxygen. As a result, the multi-domain films include QD-rich domains of QDs dispersed in the QD-compatible polymer, those domains being surrounded by QD-poor domains of the oxygen-excluding polymer. Thus, the QDs are suspended in a medium with which they are highly compatible and are protected from oxygen by the oxygen-excluding domains.

Methods of making such films are also described herein. According to some embodiments, QDs are suspended in a solution of a first polymer resin (i.e., a QD-compatible resin). The QD suspension is then added to a solution of the second polymer resin (the oxygen-excluding resin), yielding an emulsion. A film is formed of the emulsion, which can then be cured to form a solid film.

BRIEF DESCRIPTION OF THE DRAWINGS

The foregoing summary as well as the following detailed description will be better understood when read in conjunction with the appended drawings. For the purpose of illustration only, there is shown in the drawings certain embodiments. It is understood, however, that the inventive concepts disclosed herein are not limited to the precise arrangements and instrumentalities shown in the drawings.

DESCRIPTION

Figure 1:
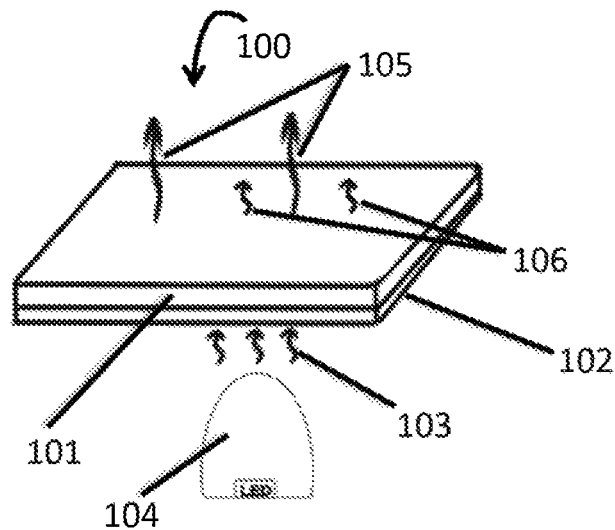
FIG. 1 is a schematic illustration of a prior art use of a film containing QDs to down-convert light emitted by a LED.

There has been substantial interest in exploiting the properties of compound semiconductor particles with dimensions on the order of 2-50 nm, often referred to as quantum dots (QDs) or nanocrystals. These materials are of commercial interest due to their size-tunable electronic properties that can be exploited in many commercial applications.

The most studied of semiconductor materials have been the chalcogenides II-VI materials namely ZnS, ZnSe, CdS, CdSe, CdTe; especially CdSe due to its tunability over the visible region of the spectrum. Reproducible methods for the large-scale production of these materials have been developed from "bottom up" techniques, whereby particles are prepared atom-by-atom, i.e., from molecules to clusters to particles, using "wet" chemical procedures.

Two fundamental factors, both related to the size of the individual semiconductor nanoparticles, are responsible for their unique properties. The first is the large surface-to-volume ratio. As particles become smaller, the ratio of the number of surface atoms to those in the interior increases. This leads to the surface properties playing an important role in the overall properties of the material. The second factor is a change in the electronic properties of the material when the material is very small in size. At extremely small sizes quantum confinement causes the material's band gap to gradually increase as the size of the particles decrease. This effect is a consequence of the confinement of an 'electron in a box' giving rise to discrete energy levels similar to those observed in atoms and molecule rather than a continuous band as observed in the corresponding bulk semiconductor material. Thus, the "electron and hole" produced by the absorption of electromagnetic radiation are closer together than they would be in the corresponding macrocrystalline material. This leads to a narrow bandwidth emission that depends upon the particle size and composition of the nanoparticle material. QDs therefore have higher kinetic energy than the corresponding macrocrystalline material and consequently the first excitonic transition (band gap) increases in energy with decreasing particle diameter.

QD nanoparticles of a single semiconductor material tend to have relatively low quantum efficiencies due to electron-hole recombination occurring at defects and dangling bonds situated on the nanoparticle surface, which may lead to non-radiative electron-hole recombinations. One method to eliminate such defects and dangling bonds on the inorganic surface of the QD is to grow a second inorganic material, having a wider band-gap and small lattice mismatch to that of the core material, epitaxially on the surface of the core particle, producing a "core-shell" particle. Core-shell particles separate any carriers confined in the core from surface states that would otherwise act as nonradiative recombination centers. One example is QDs having a ZnS shell grown on the surface of a CdSe core.

Rudimentary QD-based light-emitting devices have been made by embedding colloidally produced QDs in an optically clear LED encapsulation medium, typically a silicone or an acrylate, which is then placed on top of a solid-state LED. The use of QDs potentially has some significant advantages over the use of the more conventional phosphors, such as the ability to tune the emission wavelength, strong absorption properties, improved color rendering, and low scattering.

For the commercial application of QDs in next-generation light-emitting devices, the QDs are preferably incorporated into the LED encapsulating material while remaining as fully mono-dispersed as possible and without significant loss of quantum efficiency. The methods developed to date are problematic, not least because of the nature of current LED encapsulants. QDs can agglomerate when formulated into current LED encapsulants, thereby reducing the optical performance of the QDs. Moreover, once the QDs are incorporated into the LED encapsulant, oxygen can migrate through the encapsulant to the surfaces of the QDs, which can lead to photo-oxidation and, as a result, a drop in quantum yield (QY).

One way of addressing the problem of oxygen migration to the QDs has been to incorporate the QDs into a medium with low oxygen permeability to form "beads" of such a material containing QDs dispersed within the bead. The QD-containing beads can then be dispersed within an LED encapsulant. Examples of such systems are described in U.S. patent application Ser. Nos. 12/888,982, filed Sep. 23, 2010 (Pub. No.: 2011/0068322) and 12/622,012, filed Nov. 19, 2009 (Pub. No.: 2010/0123155), the entire contents of which are incorporated herein by reference.

Films containing QDs are described herein. FIG. 1 illustrates a prior art embodiment 100, wherein a QD-containing film 101 is disposed on a transparent substrate 102. Such a film can be useful, for example, to down-convert primary light 103 from a primary light source 104 by absorbing primary light 103 and emitting secondary light 105. A portion 106 of primary light may also be transmitted through the film and substrate so that the total light emanating from the film and substrate is a mixture of the primary and secondary light.

QD-containing films, such as film 101 in FIG. 1, may be formed by dispersing QDs in a polymer resin material and forming films of the material using generally any method of preparing polymer films known in the art. It has been found that QDs are generally more compatible with hydrophobic resins, such as acrylates, compared to more hydrophilic resins, such as epoxies. Thus, polymer films made of QDs dispersed in acrylates tend to have higher initial quantum yields (QYs) than QD films using hydrophilic resins such as epoxy resins. However, acrylates tend to be permeable to oxygen, while epoxy resin polymers and similar hydrophilic polymers tend to be better at excluding oxygen.

Figure 2:
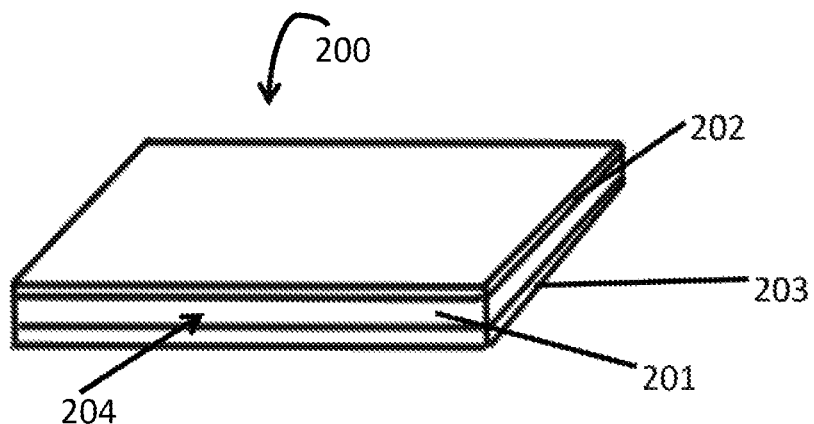
FIG. 2 is a schematic illustration of a QD-containing polymer sandwiched between transparent sheets.

One alternative for achieving high QY associated with QD-containing hydrophobic films, while also maintaining stability of the QY over time, is to insulate the film from oxygen by sandwiching the film between gas barrier sheets, as illustrated in FIG. 2. FIG. 2 illustrates a panel 200 having a polymer film 201 contained between gas barrier sheets 202 and 203. The polymer film 201 contains QDs dispersed throughout. Gas barrier sheets 202 and 203 serve to prevent oxygen from contacting the dispersed QDs. However, even in an embodiment as illustrated in FIG. 2, oxygen can permeate into the film at edges 204, resulting in a deterioration of the QY of the film.

One solution to this problem is to seal edges 204 with an oxygen barrier. However, doing so adds cost to the production of panel 200. Another option is to use a polymer 201 that is less permeable to oxygen. But as explained above, QDs are generally less compatible with such polymer resins, and therefore the optical properties of devices utilizing such polymers are less than ideal.

Figure 3:
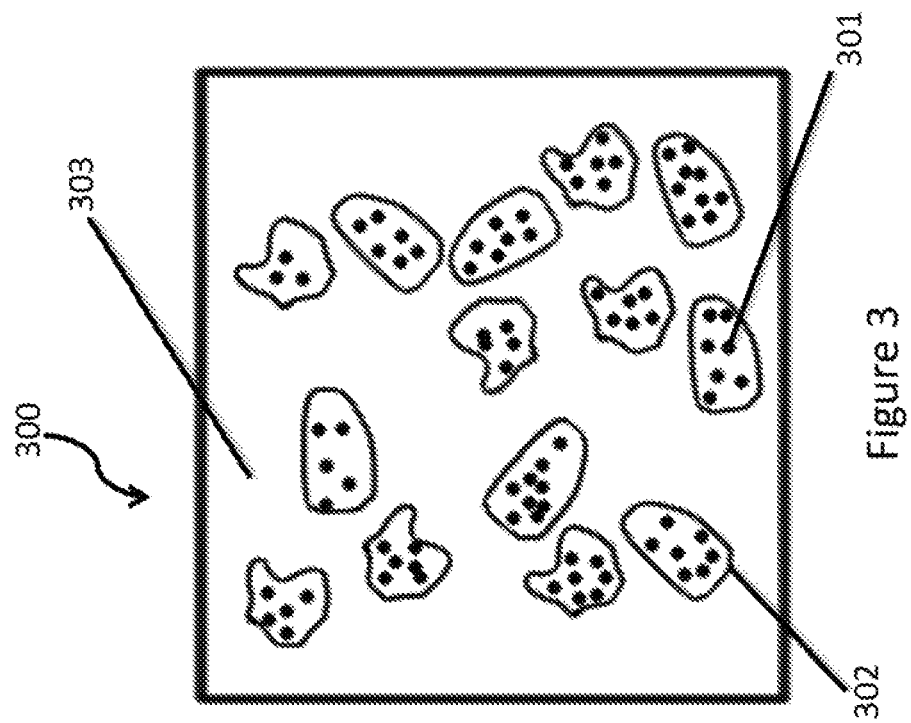
FIG. 3 is a schematic illustration of a two-phase film having a QD-compatible phase and an oxygen-excluding phase.

Multi-phase films utilizing at least a first phase (phase 1) resin that is compatible with the QD material and at least a second phase (phase 2) resin that is efficient at rejecting $O_2$ are described herein. FIG. 3 illustrates a plan view of such a film 300, wherein QDs 301 are dispersed in a first polymer phase 302, which is typically a hydrophobic material such as an acrylate resin. Regions of the first polymer phase are dispersed throughout a second polymer phase 303, which is typically an oxygen-impermeable material such as epoxy.

The multi-phase films described herein overcome many of the problems described above. The phase 1 resin is compatible with the QDs and therefore allows a high initial QY. The phase 2 resin is impermeable to oxygen, and therefore protects the QDs from oxidation without the need to seal the edges of the panel. As used herein, the term "film" includes, not only 2-dimensional (i.e. flat) sheets, as illustrated in FIGS. 1-3, but can also include 3-dimensional shapes throughout. Gas barrier sheets 202 and 203 serve to prevent oxygen from contacting the dispersed QDs. However, even in an embodiment as illustrated in FIG. 2, oxygen can permeate into the film at edges 204, resulting in a deterioration of the QY of the film.

Figure 4:
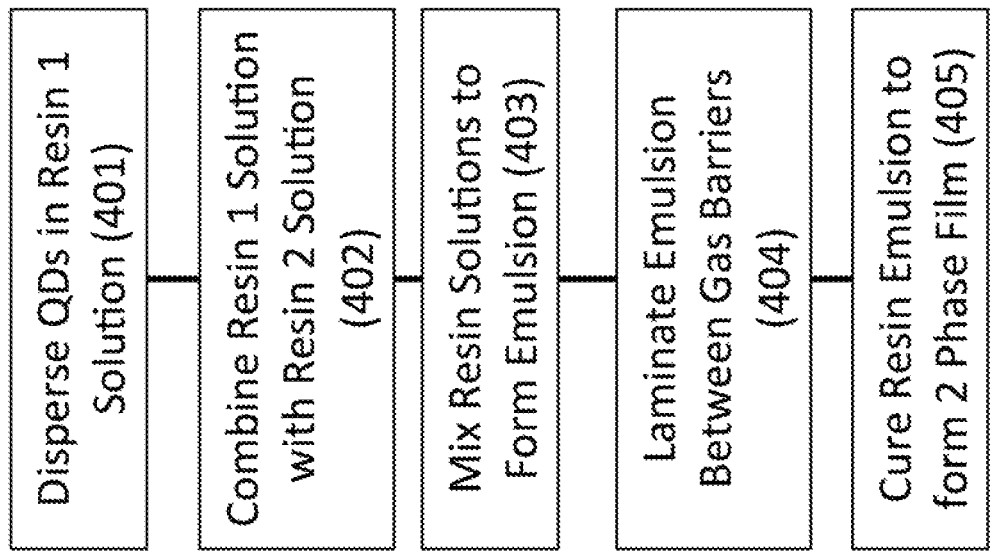
FIG. 4 is a flowchart illustrating the steps of making a two-phase film.

FIG. 4 is a flowchart illustrating steps of a method of preparing multi-phase films as described herein. The QDs are dispersed in a solution of the phase 1 resin (or resin monomer) 401. As described above, the phase 1 resin is generally a hydrophobic resin, such as acrylate resins. Examples of suitable phase 1 resins include, poly(methyl (meth)acrylate), poly(ethyl (meth)acrylate), poly(n-propyl (meth)acrylate), poly(butyl (meth)acrylate), poly(n-pentyl (meth)acrylate), poly(n-hexyl (meth)acrylate), poly(cyclohexyl (meth)acrylate), poly(2-ethyl hexyl (meth)acrylate), poly(octyl (meth)acrylate), poly(isooctyl (meth)acrylate), poly(n-decyl (meth)acrylate), poly(isodecyl (meth)acrylate), poly(lauryl(meth)acrylate), poly(hexadecyl (meth)acrylate), poly(octadecyl (meth)acrylate), poly(isobornyl (meth)acrylate), poly(isobutylene), polystyrene, poly(divinyl benzene), polyvinyl acetate, polyisoprene, polycarbonate, polyacrylonitrile, hydrophobic cellulose based polymers like ethyl cellulose, silicone resins, poly(dimethyl siloxane), poly(vinyl ethers), polyesters or any hydrophobic host material such as wax, paraffin, vegetable oil, fatty acids and fatty acid esters.

Generally, the phase 1 resin can be any resin that is compatible with the QDs. The phase 1 resin may or may not be cross-linked or cross-linkable. The phase 1 resin may be a curable resin, for example, curable using UV light. In addition to the QDs and phase 1 resin (or resin monomer), the solution of 401 may further include one or more of a photoinitiator, a cross-linking agent, a polymerization catalyst, a refractive index modifier (either inorganic one such as ZnS nanoparticles or organic one such as high refractive index monomers or poly(propylene sulfide)), a filler such as fumed silica, a scattering agent such as barium sulfate, a viscosity modifier, a surfactant or emulsifying agent, or the like.

The QD-phase 1 resin dispersion can then be mixed with a solution of the phase 2 resin (or resin monomer) 402. As explained above, the phase 2 resin is a better oxygen barrier than the phase 1 resin. The phase 2 resin is generally a hydrophilic resin. The phase 2 resin may or may not be cross-linkable. The phase 2 resin may be a curable resin, for example, curable using UV light. Examples of phase 2 resins include epoxy-based resins, polyurethanes-based resins, hydrophilic (meth)acrylate polymers, polyvinyl alcohol, poly(ethylene-co-vinyl alcohol), polyvinyl dichloride, silicones, polyimides, polyesters, polyvinyls, polyamides, enphenolics, cyanoacrylates, gelatin, water glass (sodium silicate), PVP (Kollidon). The solution of phase 2 resin may also include one or more of a photoinitiator, a cross-linking agent, a polymerization catalyst, a surfactant or emulsifying agent, or the like.

According to some embodiments, the phase 1-phase 2 mixture forms an emulsion 403, typically and emulsion of phase 1 resin suspended in phase 2 resin. The emulsion composition can be adjusted by adjusting the relative concentrations of phase 1 and phase 2 resins, the rate of stirring of the mixture, the relative hydrophobicity of the resins, and the like. One or more emulsifying agents, surfactants, or other compounds useful for supporting stable emulsions may be used.

According to certain embodiments, such as the embodiment illustrated in FIG. 2, the resin mixture is laminated between gas barrier films 404. Examples of gas barrier films include FTB3-50 (available from 3M, St. Paul, Minn.) and GX50W or GX25W (available from Toppan Printing Co., LT, Japan). Upon curing 405, the laminated resin film yields a polymer film having regions of phase 1 polymer, containing QDs, dispersed throughout phase 2 polymer, as illustrated in FIG. 3.

EXAMPLES

Example 1A

Green InP/ZnS QDs (120 Optical Density (OD)) were prepared as described in U.S. patent application Ser. No. 13/624,632, filed Sep. 23, 2011, the entire contents of which are incorporated herein by reference. The QDs were added to a degassed vial, the toluene evaporated, and the resultant solid QD re-dispersed in degassed lauryl methacrylate (LMA, 2.64 mL) containing IRG819/IRG651 (Igracure®) photoinitiators (9/18 mg). Trimethylolpropane trimethacrylate (TMPTM) crosslinker (0.32 mL) was added. The mixture was further stirred for 30 min under nitrogen affording phase 1 resin. Films of QDs in phase 1 resin were laminated between 3M gas barrier layers on an area limited by a 19 mm×14 mm×0.051 mm plastic spacer. The film was cured with a Mercury lamp for 1 min. Stability testing of the QY of the QDs in phase 1 resin is represented by square data points in the plot illustrated in FIG. 5.

Example 1B

Two-phase resin was prepared by mixing 148 microliters of the phase 1 resin with 0.5 mL degassed epoxy (Epotek, OG142) and the mixture was mechanically stirred for 3 min at 100 rpm under nitrogen. 60 Microliters of the two-phase resin was then laminated between 3M gas barrier layers on an area limited by a 19 mm×14 mm×0.051 mm plastic spacer. The film was cured with a Mercury lamp for 1 min. Stability testing of the QY of the QDs in two-phase resin comprising acrylate (phase 1) and epoxy (Epotek OG142, phase 2) is represented by diamond-shaped data points in the plot illustrated in FIG. 5.

Example 2

Green InP/ZnS QDs (120 Optical Density (OD)) were prepared as described in U.S. patent application Ser. No. 13/624,632, filed Sep. 23, 2011. The QDs were added to a degassed vial and dispersed in degassed lauryl methacrylate (LMA, 2.64 mL) containing IRG819/IRG651 photoinitiators (9/18 mg). TMPTM crosslinker (0.32 mL) was added. The mixture was further stirred for 30 min under nitrogen affording phase 1 resin. Two-phase resin was prepared by mixing 148 microliters of the phase 1 resin with 0.5 mL degassed polyurethane acrylate (Dymax OP4-4-26032) and the mixture was mechanically stirred for 3 min at 100 rpm under nitrogen. 60 Microliters of the two-phase resin was then laminated between 3M gas barrier layers on an area limited by a 19 mm×14 mm×0.051 mm plastic spacer. The film was cured with a Mercury lamp for 1-5 min. Stability testing of the QY of the QDs in two-phase resin comprising acrylate (phase 1) and polyurethane acrylate (Dymax OP-4-

Figure 5:
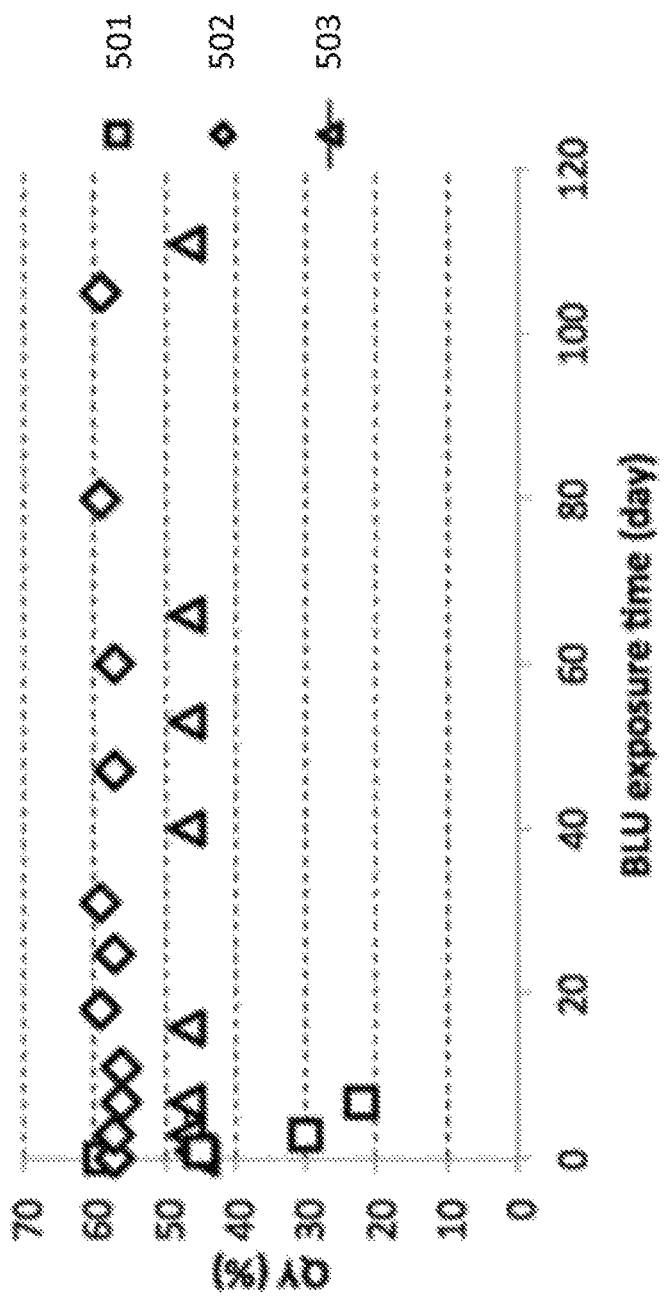
FIG. 5 is a plot of QD quantum yields in various films.

26032, phase 2) is represented by triangle-shaped data points in the plot illustrated in FIG. 5.

Example 3

Green InP/ZnS QDs (120 Optical Density (OD)) were prepared as described in U.S. patent application Ser. No. 13/624,632, filed Sep. 23, 2011. The QDs were re-dispersed in degassed lauryl methacrylate (LMA, 1.2 mL) by stirring under nitrogen overnight. IRG819 photoinitiator (3 mg) was dissolved in 0.6 mL of the QD dispersion in LMA. TMPTM crosslinker (0.073 mL) was then added. The mixture was further stirred for 30 min under nitrogen, affording phase 1 resin with QD concentration at 89.2 OD/mL. Two-phase resin was obtained by mixing 67 microliters of phase 1 resin with 0.43 mL degassed epoxy (Epotek, OG142), upon which the mixture was mechanically stirred for 3 min at 100 rpm under nitrogen. 60 Microliters of the two-phase resin was then laminated between 3M gas barrier layers on an area limited by a 19 mm×14 mm×0.051 mm plastic spacer. The films were cured with a Mercury lamp for 1 min.

Example 4

Green InP/ZnS QDs (120 Optical Density (OD)) were prepared as described in U.S. patent application Ser. No. 13/624,632, filed Sep. 23, 2011. The QDs were dispersed in degassed lauryl methacrylate (LMA, 2.64 mL) containing IRG819/IRG651 photoinitiators (9/18 mg) by stirring under nitrogen overnight. TMPTM crosslinker (0.32 mL) was added. The mixture was further stirred for 30 min under nitrogen affording phase 1 resin. Non-crosslinkable, non-viscous acrylate phase 2 resin was prepared by dissolving 10.1 mg IRG819 in deoxygenated glycidyl methacrylate (GMA, 1 mL). Non-crosslinkable, viscous acrylate phase 2 resin was prepared by dissolving polyvinylidene chloride (PVDC, Saran F310, 1.5 g) in deoxygenated GMA/IRG819/IRG651 (8.5 mL/57.5 mg/115.3 mg) solution. Two-phase resin was obtained by mixing 148 microliters of the phase 1 resin with 0.5 mL degassed phase 2 resin and the mixture was mechanically stirred for 3 min at 100 rpm under nitrogen. 60 microliters of the two-phase resin was then either added to the well of a 19 mm×14 mm glass plate or laminated between 3M gas barrier layers on an area limited by a 19 mm×14 mm×0.051 mm plastic spacer. The film was finally cured with Mercury lamp for 5 min.

Stability of Resin Films

FIG. 5 is a plot illustrating the quantum yield of resin films of QDs upon exposure to a blue backlight unit (BLU) for amounts of time (time, in days, denoted on the x-axis). The QY of green QDs in a single-phase LMA resin, as prepared in Example 1a above, is represented by square data points 501. The single-phase resin film has an initial QY of about 60%, but the QY drops substantially during the first week of exposure.

Diamond-shaped data points 502 represent the QY of a two-phase film of LMA/epoxy resin containing QDs prepared as describe in Example 1b above. The initial QY of the LMA/epoxy two-phase film is also about 60%, but unlike that of the single☐ phase film, the QY of the two-phase film remains constant over the time period of the experiment. The stability of the QY indicates that the two-phase film effectively prevents oxidation of the QDs.

Figure 6:
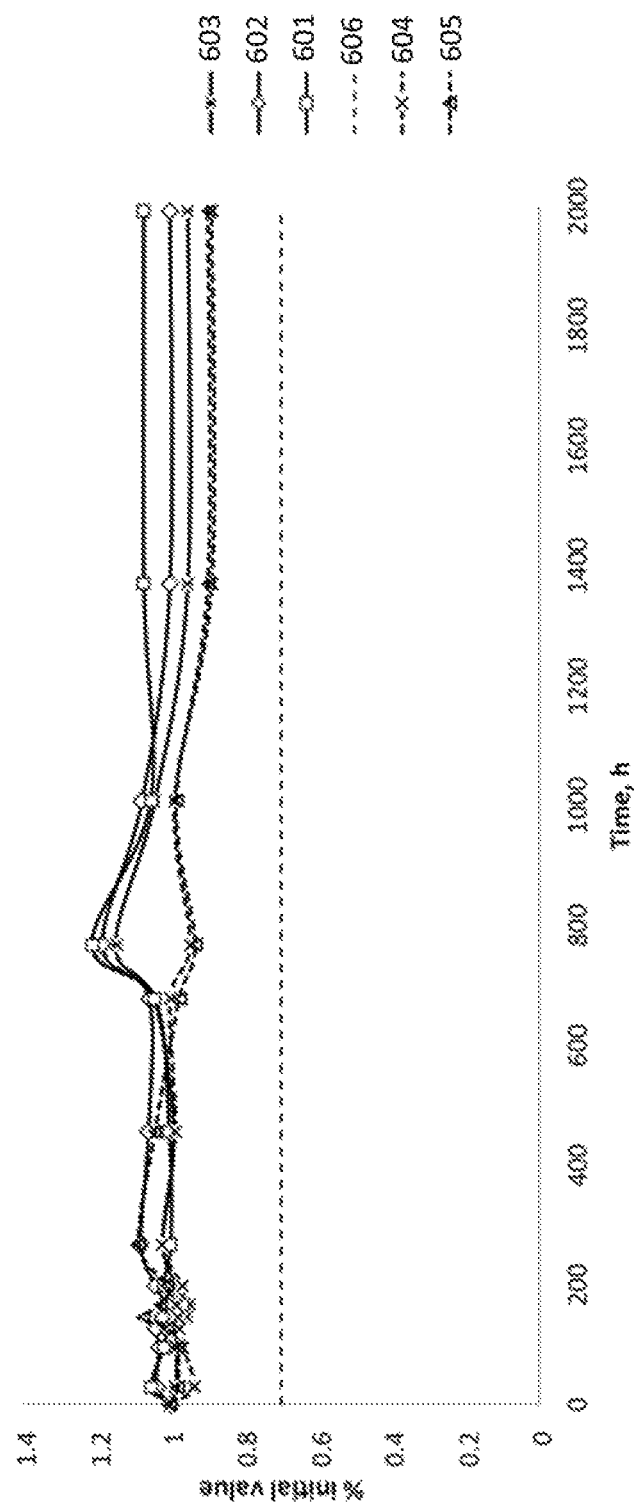
FIG. 6 illustrates stability studies of two-phase LMA/epoxy films.

Triangle-shaped data points 503 represent QY a two-phase film of QDs in LMA/polyurethane acrylate, as prepared in Example 2 above. The initial QY of the LMA/polyurethane acrylate film is about 45% and remains stable for over three months. FIG. 6 illustrates stability studies of the two-phase LMA/epoxy film prepared in Example 1b. LED intensity 601, efficacy 602, photoluminescence intensity 603, QD/LED ratio 604, and % EQE 605 remain stable and above T70 606 for at least 2000 hours.

Effect of Refractive Index of Phase 2 Resin

The phase 1 LMA resin used in the above Examples has a refractive index (RI) of 1.47. Table 1 illustrates the effect of the RI of the phase 2 resin effects the optical properties of the two-phase films.

Effect of Refractive Index of Phase 2 Resin (RI of phase 1 resin=1.47).

| Sample | Initial QY | Initial EQE | Phase 2 Resin | RI of cured Phase 2 Resin | 2-phase QY | 2-phase EQE |
|---|---|---|---|---|---|---|
| 1 | 60 | 69 | Urethane acrylate (OP4-4-20639) | 1.47 | 60 | 72 |
| 2 | 60 | 69 | Urethane acrylate (Dymax OP4-4-26032) | 1.55 | 54 | 59 |
| 3 | 60 | 69 | Epoxy (Epotek-OG142 | 1.58 | 59 | 58 |

As shown in Table 1, when the RI of the first phase and that of the second phase are matched, the initial QY and EQE of the film is maximized. When there is mismatch between the RIs of the first and second phase resins, the initial QY and EQE of the film is reduced. Thus, it is beneficial, where possible, to use first and second phase resins that have closely matched RIs. According to some embodiments, the RIs of the two resins differ by less than about 5%. According to some embodiments, the RIs of the two resins differ by less than about 1%.

Accordingly, additives such as surfactants, viscosity modifiers, monomers, light scattering agents, and other inorganic surface tension modifiers may be used to adjust the RI of one or both phases so that the RIs match. Such additives may also be used to minimize chemical interaction between the phases. Moreover, chemical antioxidants (dilaurylthiodipropionate, octadecylsulfide, octadecanethiol, cholesteryl palmitate, Zinvisible, ascorbic acid palmitate, alpha tocopherol, BHA, BHT, octane thiol, lipoic acid, glutathion, sodium metabisufite, trioctyl phosphine (TOP), tetradecylphosphonic acids, polyphenols) may be added to one or both phases to minimize the degradation of QDs around the edges of the two-phase/gas barrier encapsulated QD films.

The inventive concepts set forth herein are not limited in their application to the construction details or component arrangements set forth in the above description or illustrated in the drawings. It should be understood that the phraseology and terminology employed herein are merely for descriptive purposes and should not be considered limiting. It should further be understood that any one of the described features may be used separately or in combination with other features. Other invented systems, methods, features, and advantages will be or become apparent to one with skill in the art upon examining the drawings and the detailed description herein. It is intended that all such additional systems, methods, features, and advantages be protected by the accompanying claims.

What is claimed is:

1. A composition comprising:
a first phase comprising a first polymer and a population of quantum dots dispersed in the first polymer, and
a second phase comprising a second polymer,
wherein the first and second phases are at least partially phase-separated so as to produce a continuous domain of the second phase with domains of the first phase dispersed in the continuous domain, and
wherein the composition is formed from a first phase-in-second phase liquid-in-liquid emulsion that has been cured.

2. The composition of claim 1, wherein the first polymer is more hydrophobic than the second polymer.

3. The composition of claim 1, wherein the first polymer is an acrylate.

4. The composition of claim 1, wherein the second polymer is an epoxide.

5. The composition of claim 1, wherein a film formed from the composition is disposed between two gas barriers.

6. The composition of claim 1, wherein the reactive index of the first polymer and the refractive index of the second polymer differ by less than about 5%.

7. The composition of claim 1, wherein the reactive index of the first polymer and the refractive index of the second polymer differ by less than about 1%.

8. A method of preparing a two-phase film, the method comprising:
forming a liquid-in-liquid emulsion comprising a first phase suspended in a second phase, the first phase comprising a first polymer and quantum dots and the second phase comprising a second polymer;
depositing the emulsion between gas barrier films to form an emulsified film therebetween; and
curing the emulsified film to form a two-phase film having a continuous domain of the second phase with domains of the first phase dispersed in the continuous domain.

9. The method of claim 8, wherein forming an emulsion comprises:
forming a mixture comprising the first polymer and the quantum dots;
combining the first mixture with a solution of the second polymer to form a second mixture;
and agitating the second mixture to form the emulsion.

10. The method of claim 8, wherein the first polymer is more hydrophobic than the second polymer.

11. The method of claim 8, wherein the first polymer is an acrylate.

12. The method of claim 8, wherein the second polymer is an epoxide.

13. The method of claim 8, wherein the refractive index of the first polymer and the refractive index of the second polymer differ by less than about 1%.

14. A panel comprising a film disposed between two gas barrier sheets, the film comprising a composition according to claim 1.

15. The panel recited in claim 14, wherein the first polymer is an acrylate and the second polymer is an epoxy or a polyurethane.

16. The panel recited in claim 14, wherein the refractive index of the first polymer and the refractive index of the second polymer differ by less than 5%.

17. The panel recited in claim 14, wherein the first phase or the second phase comprises one or more of a photoinitiator, a cross-linking agent, a polymerization catalyst, a refractive index modifier, a filler, a scattering agent, a viscosity modifier, a surfactant and an emulsifying agent.

18. The composition of claim 1, wherein the quantum dots are InP/ZnS quantum dots.

19. The composition of claim 1, wherein the first phase or the second phase further comprises a photoinitiator.

20. The panel of claim 14, wherein the first phase or the second phase further comprises a photoinitiator.

21. The method of claim 8, wherein the emulsified film is cured using ultraviolet (UV) light.

22. The composition of claim 1, wherein the first phase or the second phase further comprises a chemical antioxidant.

23. The composition of claim 1, wherein the first polymer is lauryl methacrylate.

* * * * *